(12) United States Patent
Ahrens et al.

(10) Patent No.: US 10,916,515 B2
(45) Date of Patent: Feb. 9, 2021

(54) SYSTEMS AND METHODS USING AN RF CIRCUIT ON ISOLATING MATERIAL

(71) Applicant: Infineon Techologies AG, Neubiberg (DE)

(72) Inventors: Carsten Ahrens, Pettendorf (DE); Anton Steltenpohl, Munich (DE); Edward Fuergut, Dasing (DE); Anneliese Mueller, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/456,266

(22) Filed: Jun. 28, 2019

(65) Prior Publication Data
US 2020/0006262 A1  Jan. 2, 2020

Related U.S. Application Data

(62) Division of application No. 14/520,843, filed on Oct. 22, 2014, now abandoned.

(51) Int. Cl.
| | |
|---|---|
| *H01L 23/66* | (2006.01) |
| *H01L 21/66* | (2006.01) |
| *H01L 23/552* | (2006.01) |
| *H01L 21/683* | (2006.01) |
| *H01L 23/31* | (2006.01) |

(Continued)

(52) U.S. Cl.
CPC .......... *H01L 23/66* (2013.01); *H01L 21/6835* (2013.01); *H01L 22/20* (2013.01); *H01L 23/3121* (2013.01); *H01L 23/5222* (2013.01); *H01L 23/552* (2013.01); *H01L 23/642* (2013.01); *H01L 24/19* (2013.01); *H01L 24/20* (2013.01); *H01L 2221/6834* (2013.01); *H01L 2221/68327* (2013.01); *H01L 2221/68381* (2013.01); *H01L 2224/04105* (2013.01); *H01L 2224/12105* (2013.01); *H01L 2224/24137* (2013.01); *H01L 2924/1421* (2013.01)

(58) Field of Classification Search
CPC ... H01L 23/3121; H01L 23/642; H01L 23/66; H01L 24/19; H01L 24/20; H01L 24/24; H01L 24/82; H01L 2221/6834; H01L 2223/6644; H01L 2924/1421
See application file for complete search history.

(56) References Cited

U.S. PATENT DOCUMENTS

| | | |
|---|---|---|
| 6,384,492 B1 | 5/2002 | Iversen |
| 7,098,530 B2 | 8/2006 | Jansman |

(Continued)

OTHER PUBLICATIONS

Non Final Office Action dated Oct. 27, 2015 for U.S. Appl. No. 14/520,843.

(Continued)

*Primary Examiner* — David C Spalla
(74) *Attorney, Agent, or Firm* — Eschweiler & Potashnik, LLC (57) ABSTRACT

A device is disclosed that includes a wafer/chip, a first layer, a first device, an isolation mold and a second device. The first layer is formed over the chip and has non-isolating characteristics. The first device is formed over the first layer. In one example, it is formed only over the first layer. The isolation mold is formed over the chip. The isolation mold has isolating characteristics. The second device is formed substantially over the isolation mold.

22 Claims, 9 Drawing Sheets

(51) Int. Cl.
    *H01L 23/00*     (2006.01)
    *H01L 23/522*     (2006.01)
    *H01L 23/64*     (2006.01)

(56) References Cited

U.S. PATENT DOCUMENTS

| | | |
|---|---|---|
| 7,622,733 B2 | 11/2009 | Fuergut et al. |
| 8,916,433 B2 | 12/2014 | Scheiper et al. |
| 2013/0183806 A1 | 7/2013 | Booth et al. |
| 2013/0328176 A1 | 12/2013 | Chiu et al. |
| 2015/0249056 A1* | 9/2015 | Molin .................. H01L 23/562 257/506 |

OTHER PUBLICATIONS

Final Office Action dated May 20, 2016 for U.S. Appl. No. 14/520,843.
Non Final Office Action dated Jun. 30, 2017 for U.S. Appl. No. 14/520,843.
Final Office Action dated Jan. 26, 2018 for U.S. Appl. No. 14/520,843.
Non Final Office Action dated Aug. 8, 2018 for U.S. Appl. No. 14/520,843.
Final Office Action dated Jan. 10, 2019 for U.S. Appl. No. 14/520,843.

* cited by examiner

THINNED

ADHESIVE LAYER AND
CARRIER FORMED

ISOLATION ETCH AND ISOLATION
 ENCAPSULATION/MOLD FORM

SYSTEMS AND METHODS USING AN RF CIRCUIT ON ISOLATING MATERIAL

REFERENCE TO RELATED APPLICATION

This application is a divisional of U.S. patent application Ser. No. 14/520,843 filed Oct. 22, 2014, the contents of which are herein incorporated by reference in their entirety.

BACKGROUND

Radio frequency (RF) circuits and metal lines are typically formed on bulk semiconductor. As a result, inductive and capacitive coupling between these elements, the circuits and metal lines, and the bulk semiconductor can occur.

The unwanted coupling degrades performance and operation of the elements. For example, the coupling can deteriorate an original RF signal. Additionally, some of the signal power can be lost due to resistive losses. Further, undesired signals can be generated, such as harmonic frequencies. Additionally, intermodulation may occur when different signals interfere and crosstalk can be generated.

Mechanisms to reduce the unwanted coupling and degradation of performance are needed.

DETAILED DESCRIPTION

The present invention will now be described with reference to the attached drawing figures, wherein like reference numerals are used to refer to like elements throughout, and wherein the illustrated structures and devices are not necessarily drawn to scale.

Sensor systems and methods are disclosed that use a mold or encapsulation material instead of silicon or other semiconductor materials from target areas. The target areas typically include RF circuitry, metal lines, high frequency components, and the like. As a result, inductive coupling, capacitive coupling, non-linear resistances and the like are mitigated.

Figure 1:
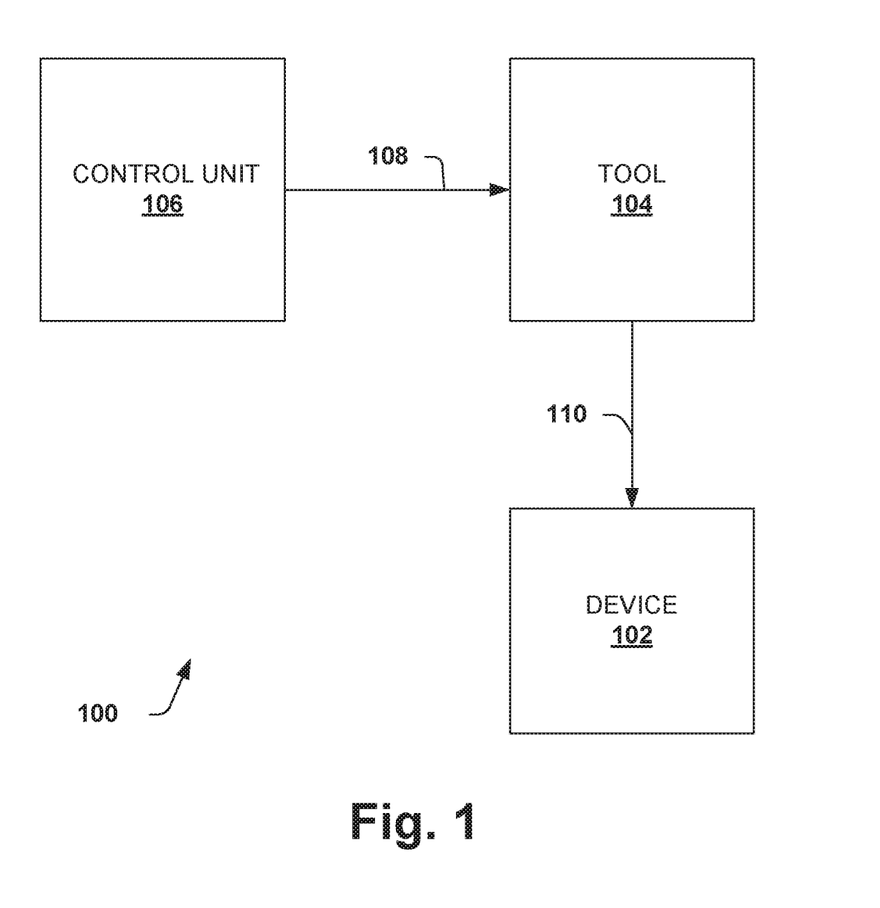
FIG. 1 is a diagram illustrating a system for fabricating semiconductor devices that enhance RF signal integrity.

FIG. 1 is a diagram illustrating a system 100 for fabricating semiconductor devices that enhance RF signal integrity. The system 100 identifies target areas and replaces interfering material with a mold or encapsulation material. The target areas typically include areas that have high power and/or high frequency signals generated or pass there through.

The system 100 is provided for illustrative purposes and in a simplified form. It is appreciated that fabrication systems can include additional components and elements.

The system 100 includes a control unit 106 and a process tool 104 and performs semiconductor fabrication on a device 102. The device 102 includes high frequency circuits and components and high power circuits and components. The high frequency circuits include RF related circuits, such RF generation and processing circuits. The high frequency components include metal lines used for transferring high frequency signals, such as components that provide high frequency signals to power amplifiers, antenna, from transceivers, to receivers, and the like. These components are susceptible to inductive coupling, capacitive coupling, non-linear resistance, crosstalk and the like. Areas of the device that include these components are referred to as target areas.

The process tool 104 is coupled to the device 102 and performs semiconductor fabrication processes 110 on the device 102. The process tool 104 can include one or more components, such as chambers, etching tools, and the like. The one or more components are used for performing various etching processes, fill processes, and the like. The processes 110 performed by the process tool 104 include front end and back end processes. Additionally, the processes include isolation processes that remove coupling regions from target areas and form isolation molds in the target areas that enhance signal integrity of device 102, including the high frequency circuits and components. The coupling regions include a thickness and/or depth of semiconductor material, such as silicon. The isolation molds include formed, filled or deposited mold or encapsulation material that is configured to isolate surrounding circuitry and components and mitigate inductive and capacitive coupling. The mold or encapsulation material includes plastic, encapsulants, Polymide, nylon and the like. Generally, the mold or encapsulation material is substantially free of carriers, which provides suitable isolation and mitigates generation of unwanted noise/signals, such as harmonics.

The control unit 106 controls operation of the process tool 104 to perform semiconductor fabrication on the device 102. The control unit 106 provides controls 108 to the process tool 104. Generally, the control unit 106 generates and provides controls 108 to the process tool 104 that identify target areas, selectively remove coupling regions and form isolation molds for the device 102. The controls 108 include identification of the target areas that include high frequency components, high frequency circuits, high power components, high power circuits, target regions, and the like.

Figure 2:
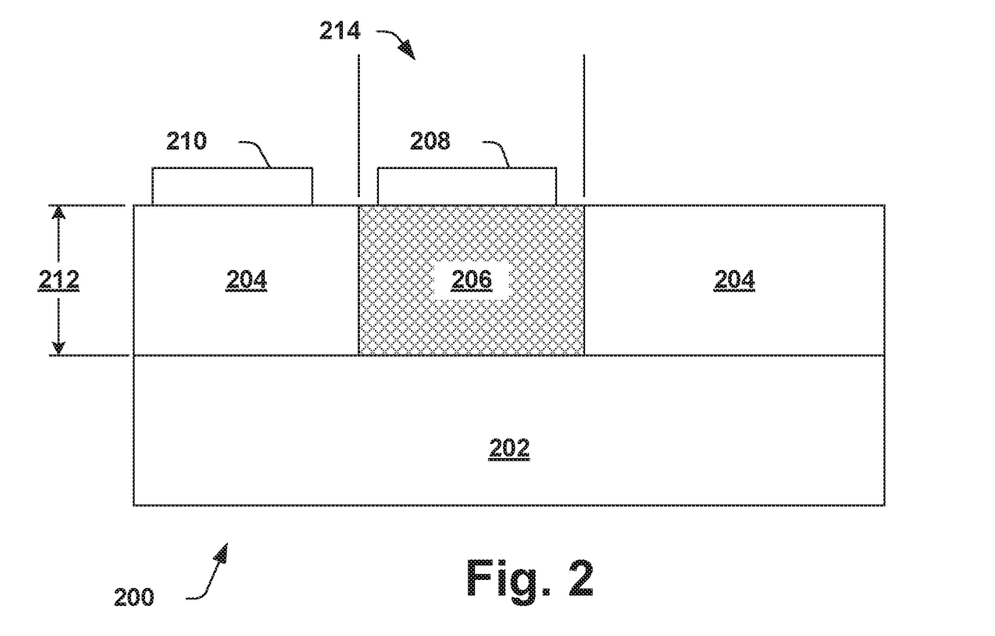
FIG. 2 is a cross sectional view of a semiconductor device with enhanced RF signal integrity.

FIG. 2 is a cross sectional view of a semiconductor device 200 with enhanced RF signal integrity. The device 200 can be formed as the device 102, described above with regards to FIG. 1. The device 200 has enhanced RF signal integrity by having isolation molds formed within target areas of the device that include high frequency circuits and/or components. It is appreciated that the device 200 is presented in simplified form to facilitate understanding. It is further appreciated that variations in the layers, materials, dimensions, and the like are contemplated.

The device 200 includes a wafer 202, a first layer 204, an isolation mold within a target area 214, a high frequency component 208, and a second component 210. The wafer 202 includes a silicon wafer, other semiconductor wafer, and an artificial/reconstituted wafer. For a silicon wafer standard semiconductor fabrication techniques can be used, including performing fabrication processes using front end processing, isolation processes, and back end processes. For an artificial wafer, often used as part of embedded wafer level ball grid array (eWLB) technology, front end processes are formed on a semiconductor wafer, but then diced into singulated chips and placed on a carrier. The singulated chips are reconstituted with the artificial wafer using a mold frame around the singulated chips for carrying additional interconnect elements.

The first layer 204 is formed on/over the wafer 202. The first layer 204 is typically a silicon semiconductor material. The first layer 204 can formed by a suitable fabrication process or can be a portion of the wafer 202. In one example, the first layer 204 is formed by depositing semiconductor material on the wafer 202. In another example, the first layer 204 is an upper portion of the wafer 202.

The target area 214 indicates an area or region of the device 200 that benefits from isolation, such as high frequency circuits and components. Within the target area 214, a portion of the first layer 204 has been removed. In its place, an isolation mold 206 has been formed. The isolation mold 206 is comprised of an isolation material, such as described above.

A high frequency component 208 is formed on/over the isolation mold 206. The high frequency component 208 can include, for example, high frequency circuits that have the potential to generate noise, such as harmonics, if not isolated. The component 208 can include circuits and components, such as metal lines, metallization layers, and the like that carry high frequency signals. A width of the isolation mold 206 is selected to include or substantially include the component 208. Further, a depth 212 of the isolation mold 206 is selected to provide suitable isolation. It is appreciated that the depth 212 can vary according to circuits or components within the component 208. In one example, a relatively high amount of isolation is provided by using a relatively deep depth 212. In another example, a relatively low amount of isolation is provided by using a relatively shallow depth 212.

When high frequency circuits and components are formed on a silicon substrate or semiconductor, unwanted noise and signals are typically generated. For example, a metal layer formed on a silicon substrate acts as a capacitor where the silicon substrate acts as a capacitor dielectric material. Thus, the silicon substrate has non-isolation characteristics including free carriers, coupling capacitance, coupling inductance, non-linear resistivity, non-linear capacitance, non-linear inductance and the like. These non-isolation characteristics can cause the generation of the unwanted noise and signals, including harmonics and harmonic frequencies. These unwanted signals and noise can violate communication standards and specifications, interfere with other communications, and degrade RF signals. For example, a transmission signal generated at a first frequency can result in second order harmonics generated at twice the first frequency.

However, due to the presence of the isolation mold 206, high frequency signals are enhanced and their integrity maintained. The non-isolation characteristics are mitigated. Unwanted noise and signals, such as harmonics, crosstalk, and the like are at suitably low power levels such that interference with out of band communications are prevented or lessened. Additionally, the isolation mold 206 can mitigate leakage paths between the device 208 and other devices, such as the device 210. Further, the isolation mold 206 provides or enhances protective characteristics, such as strengthening the device 200. In A second component 210 is shown formed over the first layer 204. The first layer 204 may have inductive coupling and capacitive coupling characteristics, which would be problematic for RF circuits. However, in this example, the second component does not include high frequency components and can tolerate the coupling characteristics.

FIGS. 3A to 3F are cross sectional diagrams illustrating a semiconductor device 300 fabricated with isolation molds that enhance RF signals and mitigate noise and unwanted signals.

Figure 3A:
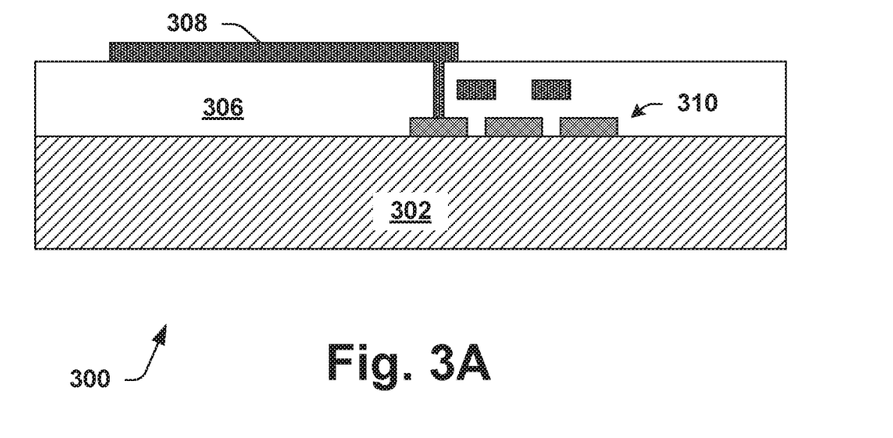
FIG. 3A is a cross sectional diagram of the semiconductor device after one or more front end processes are performed.

FIG. 3A is a cross sectional diagram of the semiconductor device 300 after one or more front end processes are performed. The front end processes form initial layers and processing on the device including substrate formation, base dopant implants, planarization, and the like.

The device 300 is shown with a silicon wafer or substrate 302. One or more active devices 310 are formed about the substrate 302. The devices 310 can be formed, for example, on the substrate 302, partially within the substrate 302, and/or over the substrate 302. The devices 310 can include active components, such as transistors and the various types of transistors, or passive components, such as inductors, capacitors, resistors, and the like. The device 300 shows three devices 310 for illustrative purposes only. It is appreciated that any suitable number of devices can be present.

A first layer 306 is formed over the substrate 302. The first layer 306 can be comprised of a semiconductor material. In one example, the first layer 306 is comprised of an insulating material, such as silicon oxide. The example presented shows the devices 310 formed within the first layer 306.

Interconnects 308 are shown formed within and on the first layer 306. The interconnects 308 provide electrical connections between the devices 310 and other components, including packaging and external device connections. Typically, the interconnects 308 include metallization and/or metal layers. When carrying high frequency signals, the interconnects 308 can generate unwanted noise and signals due to non-isolating characteristics, as described above. As shown, the interconnects 308 include a metal line formed on the first layer 306. The metal line, in this example, carries high frequency signal and is considered to be a high frequency circuit or component.

Figure 3B:
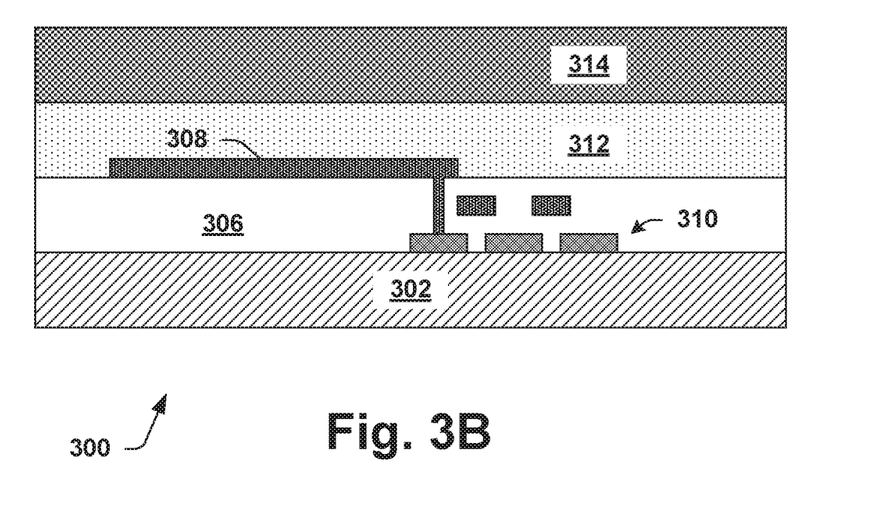
FIG. 3B is a cross sectional diagram of the semiconductor device after wafer carrier attachment and wafer thinning.

FIG. 3B is a cross sectional diagram of the semiconductor device 300 after wafer carrier attachment and wafer thinning. An adhesive layer 312 is formed on/over the first layer 306. A carrier layer 314 is shown over the adhesive layer 312. The carrier layer 314 is attached to the device 300 by the adhesive layer 312. The adhesive layer 312 is comprised of a suitable adhesive material and sufficiently holds the carrier layer 314 to the device. The adhesive layer 312 can include thermal adhesive materials, wherein the adhesive layer 312 releases based on thermal/heat.

The carrier layer 314 supports or holds the device 300. The carrier layer 314 supports the device 300 to facilitate further semiconductor fabrication processing steps. Additionally, the carrier layer 314 protects the underlying layers during other or subsequent fabrication processing.

Subsequent to attaching the carrier layer 314 to the device 300, the substrate/wafer 302 is thinned using a thinning or polishing process. This process removes a selected amount of material from the substrate/wafer 302.

Figure 3C:
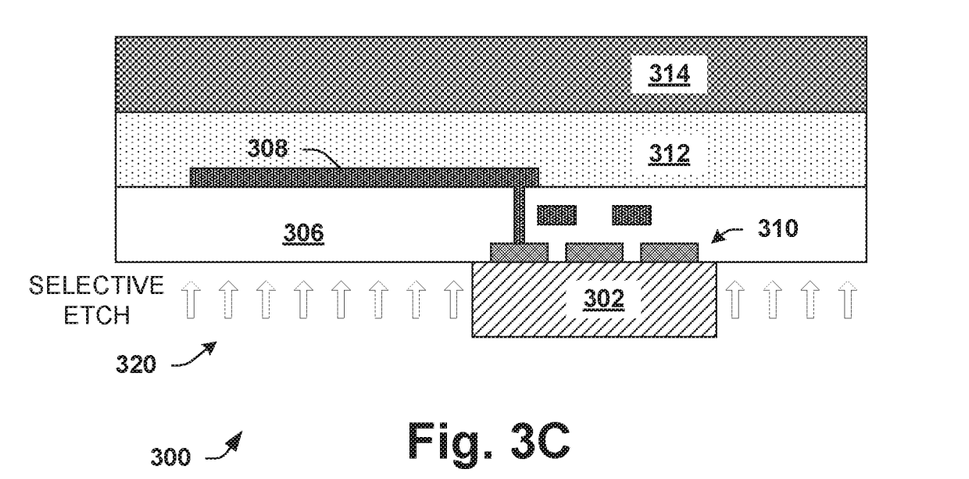
FIG. 3C is a cross sectional diagram of the semiconductor device 300 after removal of portions of the substrate.

FIG. 3C is a cross sectional diagram of the semiconductor device 300 after removal of portions of the substrate 302. The carrier layer 314 remains attached to the device 300 and continues to protect its underlying layers and devices.

Areas of the device are identified for removal. These areas are referred to as target areas and include areas having high frequency circuits or components, such as metal lines configured to carry high frequency signals. A control unit, such as the unit 106 described above, or other suitable technique can be used to identify the target areas.

The portions of the substrate 302 to be removed are referred to as coupling regions. Such regions are likely to generate unwanted noise and/or signals when proximate to the high frequency circuits or components. In this example, a target area is identified that includes a substantial portion of the metal line formed on the first layer 306. The substrate 302 to be removed within this target area is the coupling region.

A selective etch process 320 removes the coupling region(s) from the target areas. A suitable process, such as a wet etch, plasma etch, and the like, is used to perform the selective removal.

Figure 3D:
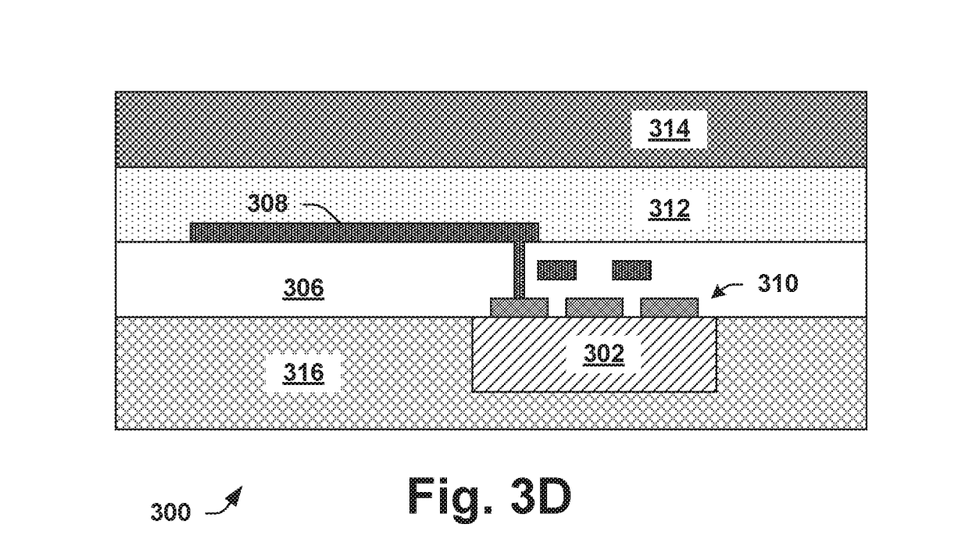
FIG. 3D is a cross sectional diagram of the semiconductor device after forming an isolation mold.

FIG. 3D is a cross sectional diagram of the semiconductor device 300 after forming an isolation mold. The isolation mold isolates the high frequency components from the substrate and mitigates unwanted generation of unwanted noise and signals.

It can be seen that the coupling regions of the substrate 302 have been removed. Mold or encapsulation material, such as plastic, encaplsulants, buffering materials and the like is formed in at least portions of the removed coupling regions. The mold or encapsulation material is deposited or attached to the device using a suitable process, such as a deposition process. The deposited mold or encapsulation material forms an isolation mold 316 that isolates components and circuits within the target areas. In this example, the isolation mold 316 isolates the metal line formed on the first layer 306. In addition to providing isolating characteristics, the isolation mold 316 provides protective characteristics. For example, the isolation mold can be configured to facilitate strength, stability, and the like. Further, the isolation mold 316 can facilitate handling of the device without damaging the device 300, such as from marking, bonding, and the like.

Figure 3E:
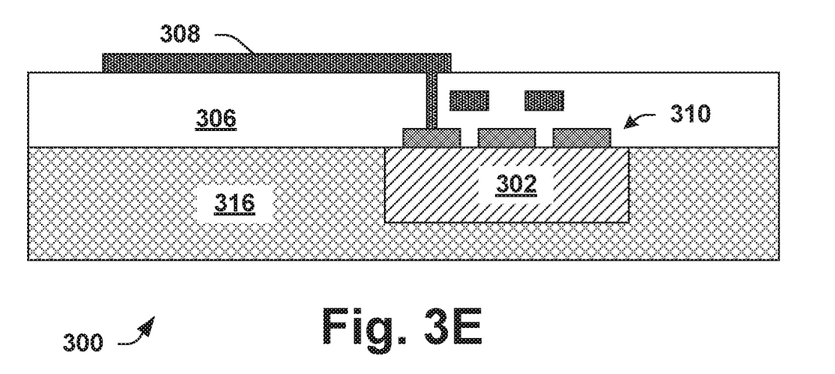
FIG. 3E is a cross sectional diagram of the semiconductor device after removal of the adhesive layer and the carrier layer.

FIG. 3E is a cross sectional diagram of the semiconductor device 300 after removal of the adhesive layer 312 and the carrier layer 314. A thermal process is used to heat the device 300 or the adhesive layer 312. The adhesive layer 312 is configured to lose adhesion upon reaching a set temperature. Thus, heating the adhesive layer 312 to the set temperature permits removal of the carrier layer. It is appreciated that other types of adhesive layers can be used instead of the layer 312, that utilize other removal techniques or release mechanisms. For example, the adhesive layer 312 can use glass carrier, ultraviolet, and the like removal techniques or release mechanisms.

Figure 3F:
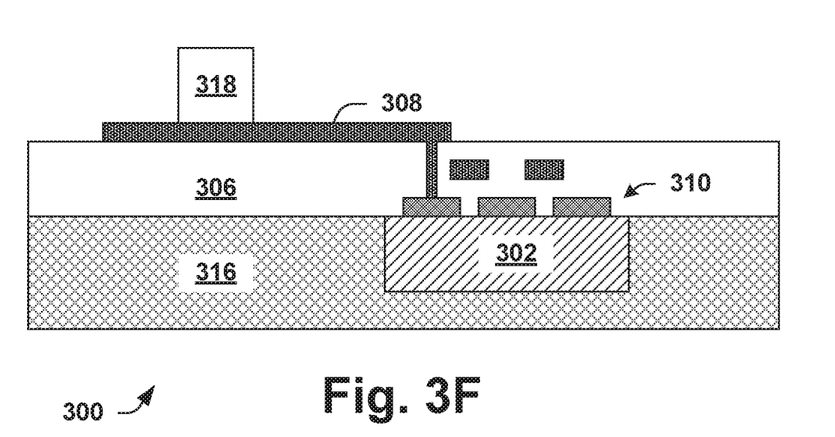
FIG. 3F is a cross sectional diagram of the semiconductor device after pillar formation.

FIG. 3F is a cross sectional diagram of the semiconductor device 300 after pillar formation. An interconnect 318 comprised of conductive material is formed in contact with the metal line of the interconnects 308. An example of a suitable conductive material is copper. The interconnect 318 can include, for example, bumps, contacts, terminals, redistribution layer(s), pillars, bond wire, metallization line, and the like.

The device 300 is shown with the interconnect as a single pillar for illustrative purposes. It is appreciated that the device 300 can include other elements, such as pillars, terminals, and contacts for providing contacts to external components and other devices.

Figure 4A:
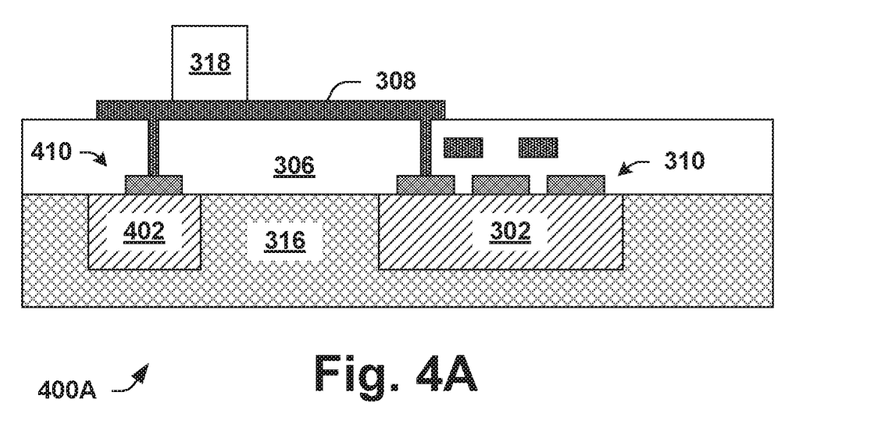
FIG. 4A is a cross sectional view of a semiconductor device.
Figure 4B:
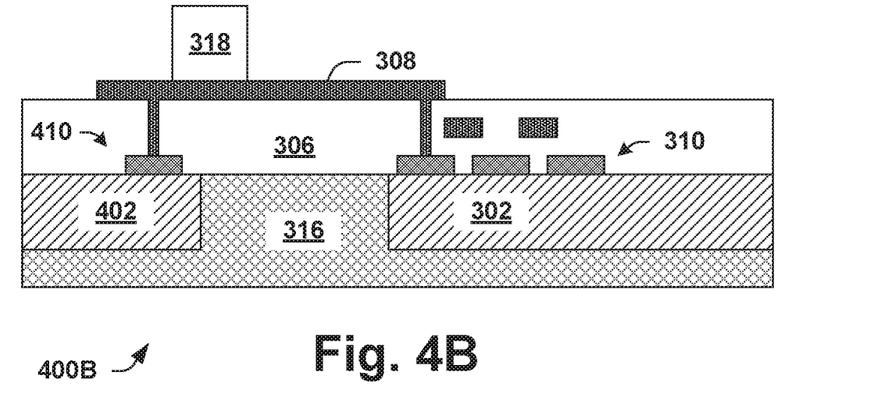
FIG. 4B is another cross sectional view of a semiconductor device.
Figure 4C:
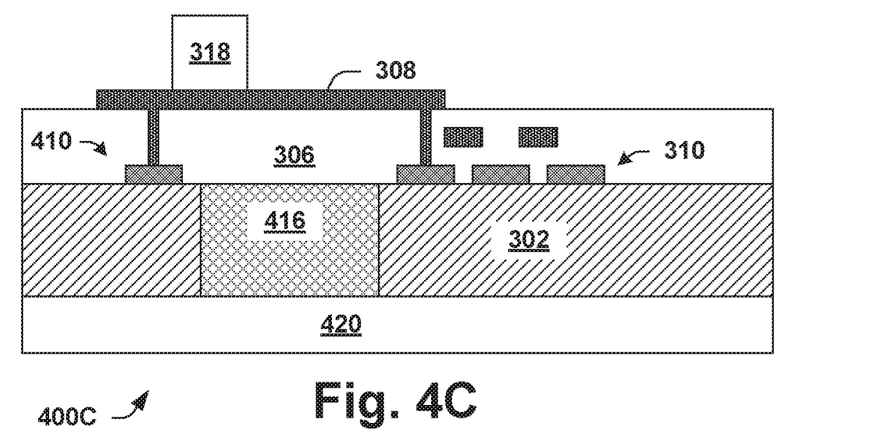
FIG. 4C is yet another cross sectional view of a semiconductor device.

FIGS. 4A, 4B and 4C provide examples of semiconductor devices using isolation molds to enhance operation. It is appreciated that other variations are permitted.

FIG. 4A is a cross sectional view of a semiconductor device 400A. The device 400A includes components and layers similar to the device 300, described above. Additional description of like numbered components and layers can be found above.

The device 400A includes a first substrate 302, a second substrate 402, first devices 310, second devices 410, interconnects 308, a first layer 306, a copper pillar 318, and an isolation mold 316. The first substrate 302 and the second substrate 402 are comprised of a semiconductor material such as silicon. The first substrate 302 and the second substrate 402 were a single layer or substrate prior to a selective etch.

One or more first devices 310 are formed on the substrate 302. The devices 310 include active components and/or passive components. Similarly, one or more second devices 410 are formed on the substrate 402. The devices 410 also include active and/or passive components. The first layer 306 is present and formed over the substrates 302 and 402.

Interconnects 308 are shown and selectively connect the devices 410 and 310. Additionally, the interconnects 308 are also configured to provide electrical connections between the devices 410 and 310 and other components, including packaging and external device connections. The interconnects 308 include metallization and/or metal layers. Without isolation molds, at least portions of the interconnects 308 could generate unwanted noise or signals, such as harmonics.

The device 400A has been formed so that the isolation mold 316 underlies and isolates portions of the interconnects 308. Additionally, the isolation mold 316 also separates and prevents leakage between the devices 410 and 310. FIG. 4A shows an isolated metal line of the interconnects 308.

It is noted that, in this example, non-RF regions of the device have directly underlying substrate. However, it is appreciated that other variations are possible.

FIG. 4B is another cross sectional view of a semiconductor device 400B. The device 400B includes components and layers similar to the device 300, described above. Additional description of like numbered components and layers can be found above.

The device 400B includes a first substrate 302, a second substrate 402, first devices 310, second devices 410, one or more interconnects 308, a first layer 306, a first interconnect 318, and an isolation mold 316. The first substrate 302 and the second substrate 402 are comprised of a semiconductor material such as silicon. The first interconnect 318 can include, for example, bumps, contacts, terminals, redistribution layer(s), pillars, bond wire, metallization line, and the like The device 400B is similar to that of 400A. However, the isolation mold 316 substantially underlies only the metal line of the interconnects 308. Thus, the isolation mold 316 only underlies the target area and is present in the coupling region. A lower portion of the isolation mold 316 is shown as substantially present under even the substrates 302 and 402. However, it is appreciated that the isolation mold 316 may be omitted under the substrates 302 and 402 as well.

FIG. 4C is yet another cross sectional view of a semiconductor device 400C. The device 400C includes components and layers similar to the device 300, described above. Additional description of like numbered components and layers can be found above.

The device 400C includes a first substrate 302, a second substrate 402, first devices 310, second devices 410, interconnects 308, a first layer 306, a copper pillar 318, and an isolation mold 416. The first substrate 302 and the second substrate 402 are comprised of a semiconductor material such as silicon.

The device 400C is similar to that of 400A and 400B. However, the isolation mold 416 is only substantially under the metal line portion of the interconnects 308. The device 400C can be obtained, for example, by grinding the encapsulation material from the isolation mold 416 to thin the mold until the substrate 302 is exposed. Subsequently, a shielding layer 420 is formed that underlies the substrate 302 and the isolation mold 416. The shielding layer 420 can be formed by a suitable process, such as sputtering. In one example, the shielding layer 420 is formed by sputtering copper to form a copper layer.

Other fabrication techniques can also be used to form the isolation mold 416. For example, a trench formation process can be used to remove substrate material and then form the isolation mold 416 within the formed trench.

FIGS. 4A, 4B and 4C illustrate some variations that enhance RF signals and mitigate non-isolation characteristics. It is appreciated that other suitable variations are contemplated.

FIGS. 5A to 5D are cross sectional diagrams illustrating a semiconductor device 500 fabricated with isolation molds that enhance RF signals and mitigate noise and unwanted signals. The device 500 includes components and layers similar to the device 300, described above. Additional description of like numbered components and layers can be found above.

Figure 5A:
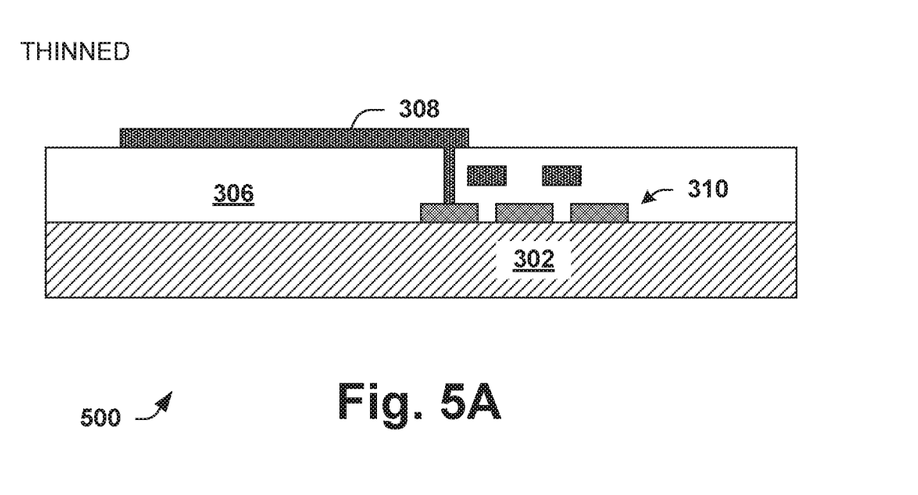
FIG. 5A is a cross sectional diagram of the semiconductor device after one or more front end processes have been performed.

FIG. 5A is a cross sectional diagram of the semiconductor device 500 after one or more front end processes have been performed. The device includes a substrate 302, one or more devices 310, a first layer 306 and interconnects 308. The one or more front end processes have been performed and the substrate 302 has been thinned by a suitable process.

Figure 5B:
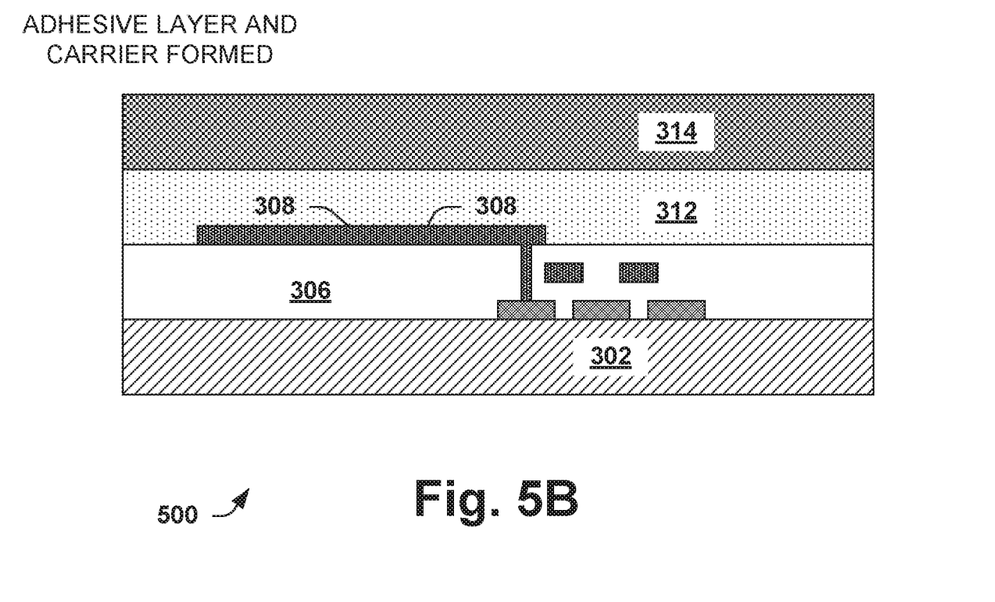
FIG. 5B is a cross sectional diagram of the semiconductor device after a carrier layer has been attached to the device.

FIG. 5B is a cross sectional diagram of the semiconductor device 500 after a carrier layer has been attached to the device 500. An adhesive layer 312 attaches a carrier layer 314 to the device 500. The adhesive layer 312 is comprised of an adhesive material configured to release upon a set condition, such as a temperature exceeding a value. The carrier layer 314 protects the underlying layers, such as the devices 310, from damage.

Figure 5C:
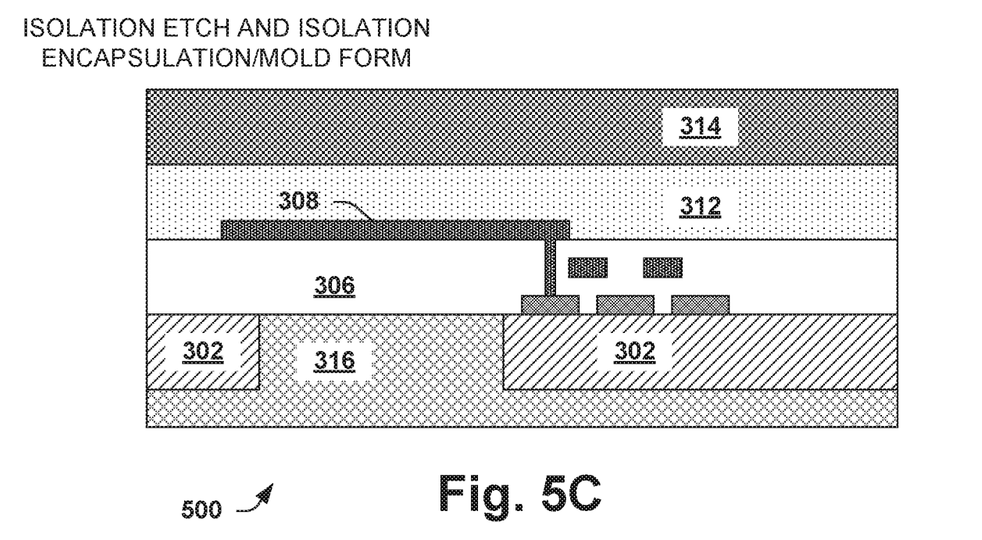
FIG. 5C is a cross sectional diagram of the semiconductor device after an isolation etch and isolation mold is formed.

FIG. 5C is a cross sectional diagram of the semiconductor device 500 after an isolation etch and isolation mold is formed. The isolation etch is performed on coupling regions within identified target areas of the device. Here, the coupling regions lie below RF components/circuits, such as the metal line of the interconnects 308. It is noted that substrate material is only removed from these target areas.

An isolation mold formation process then forms an isolation mold 316 within and about the substrate 302. The isolation mold 316 is formed within the coupling regions of the target areas. The isolation mold 316 enhances RF signals that travel through the metal line portion of the interconnects by limiting or preventing non-isolating characteristics from impacting the metal line.

It is appreciated that the isolation mold formation process can involve flipping the device 500 so that the substrate 302 is on top, and then depositing or forming the mold or encapsulation material over the device 500.

Figure 5D:
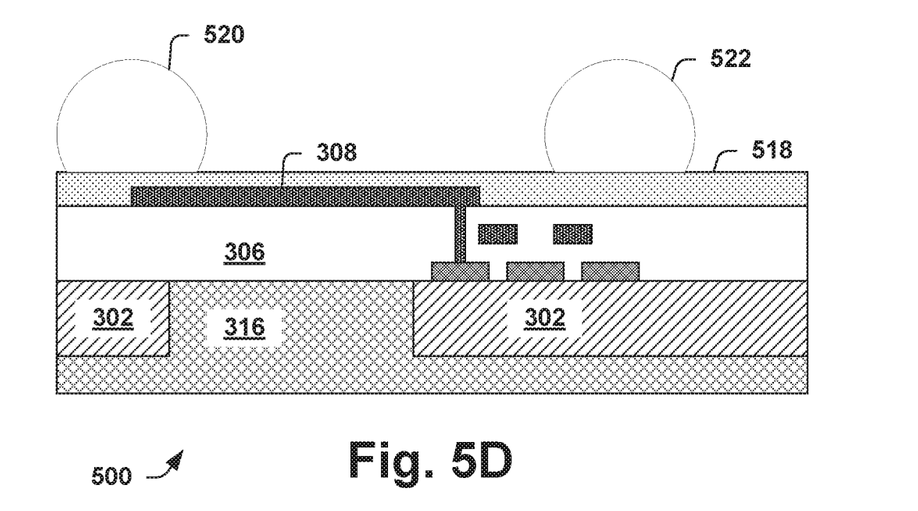
FIG. 5D is a cross sectional diagram of the semiconductor device after debonding.

FIG. 5D is a cross sectional diagram of the semiconductor device 500 after debonding. An adhesive removal process, such as a thermal process, removes the carrier layer 314 from the device 500. Additionally, the adhesive layer 312 is also removed.

Connecting or interconnecting structures, such as copper pillars, solder balls 520 and 522 and the like, are formed over and/or within an insulating layer 518. The insulating layer 518 is comprised of an electrically isolating material and is formed on the first layer 306.

It is appreciated that the device 500 can be configured with other semiconductor devices for as part of embedded wafer level ball grid array (eWLB).

Figure 6:
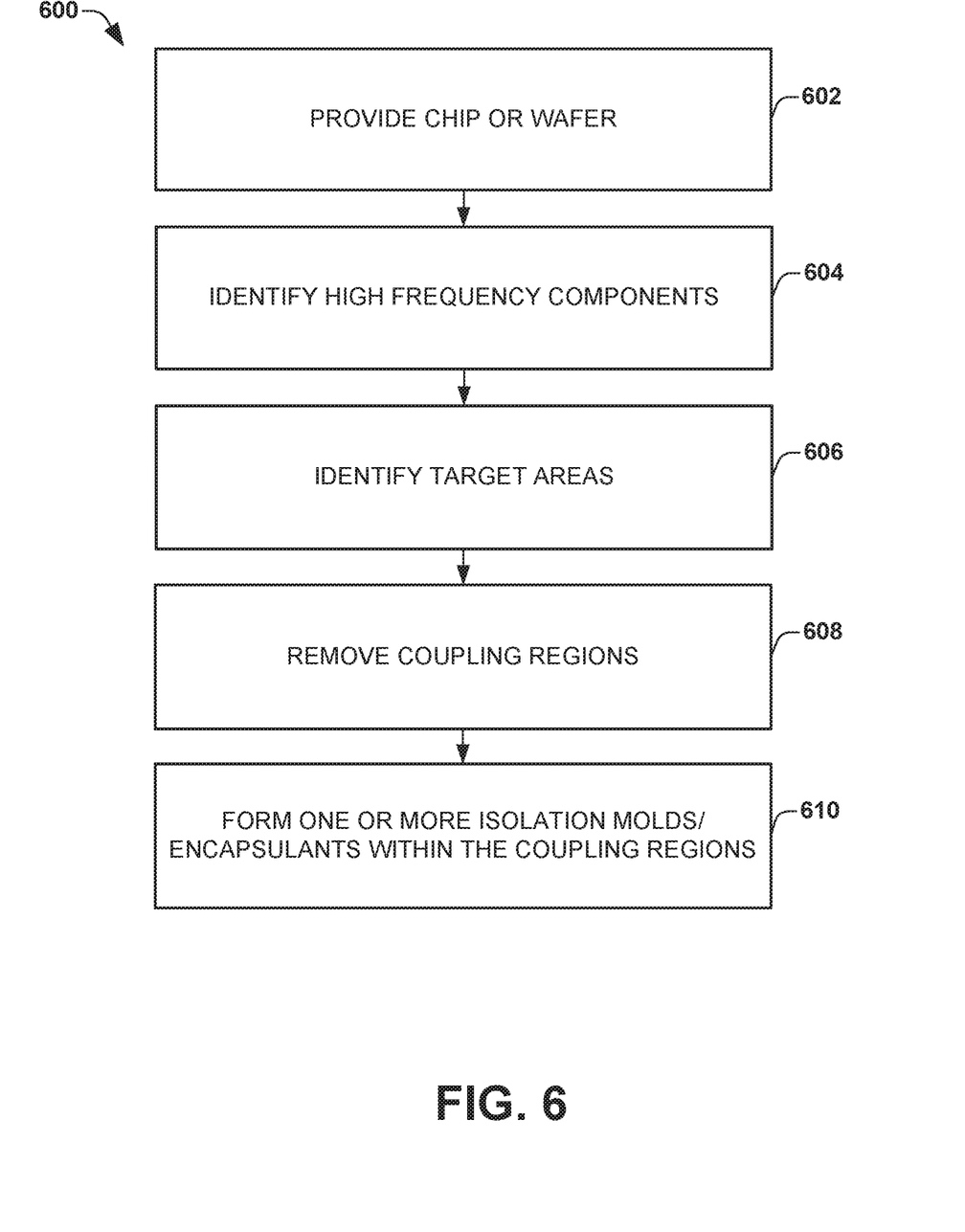
FIG. 6 is a flow diagram illustrating a method of fabricating a device with enhanced RF signal integrity.

FIG. 6 is a flow diagram illustrating a method 600 of fabricating a device with enhanced RF signal integrity. The method 600 incorporates isolation molds in areas of the device that handle high frequency signals, such as metal lines.

The method 600 begins at block 602, where a semiconductor device, chip and/or wafer is provided. The device includes a plurality of components, such as circuits, passive components, active components, and the like. The device also includes a wafer, such as a silicon wafer or a reconstituted artificial wafer.

High frequency components of the device are identified by a control unit using a process tool at block 604. The high frequency components include metal lines, interconnects, amplifiers, capacitors, metal capacitors, transistors, isolators, resistors, terminals, contacts, inductors and the like that generate or convey high frequency signals. In one example, the high frequency components are already identified. In another example, the control unit analyzes the components to identify those that generate or convey high frequency signals.

Target areas of the device are identified by the control unit at block 606. The target areas include areas of the device that include the identified components. Additionally, the target areas can also include areas or regions where there may be leakage between components or circuits. Further, the target areas can include sidewalls wherein high frequency components are located.

Coupling regions of the wafer or other layers formed on the wafer are identified by the control unit and removed at block 608. The coupling regions are within the target areas and include the identified target areas. Additionally, the coupling regions have a selected depth that depends on the components within those regions.

One or more isolation molds are formed within or over the coupling regions by the control unit using the process tool at block 610. The isolation molds are formed using a suitable mold formation process. Some examples include encapsulation, deposition, and the like. In one example, the device is flipped prior to depositing or forming the isolation molds. Subsequently, the device is again flipped.

It is appreciated that other fabrication process can be performed, including forming of interconnects, metallization layers, metal lines, front end processing, back end processing, carrier layers, and the like.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown in FIGS. 1, 2, etc., are non-limiting examples of system that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A device is disclosed that includes a wafer or chip, a first layer, a first device, an isolation mold and a second device. The first layer is formed over the wafer/chip and has non-isolating characteristics. The first device is formed over the first layer. In one example, it is formed only over the first layer. The isolation mold is formed over the wafer/chip. The isolation mold has isolating characteristics. The second device is formed substantially over the isolation mold.

A fabricating system having a process tool and a control unit is disclosed. The process tool is configured to perform fabrication processes on a semiconductor device. The control unit is configured to control the process tool and identify target areas of the device having high frequency components, remove underlying substrate of the target areas and form isolation molds within the target areas.

A method of fabricating a device is disclosed. A semiconductor device having a wafer/chip and a plurality of components associated therewith is provided. One or more high frequency components that handle or utilize high frequency signals of the plurality of components are identified. Target areas that include the one or more identified high frequency components are identified. Coupling regions of the wafer/chip within the target areas are removed. One or more isolation molds are formed within the one or more target areas.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A fabricating system to enhance radio frequency (RF) signals comprising:
   a process tool configured to perform fabrication processes on a semiconductor device; and
   a control unit configured to control the process tool and to identify target areas of the semiconductor device having high frequency components, remove underlying substrate material of the target areas and form a plurality of isolation molds only within the target areas.

2. The system of claim 1, wherein the isolation molds include an encapsulation material.

3. The system of claim 1, wherein the control unit is configured to form coupling regions within the identified target areas prior to forming the plurality of isolation molds.

4. The system of claim 1, wherein the high frequency components are predetermined.

5. The system of claim 1, wherein the control unit is configured to analyze a plurality of regions of the semiconductor device for generation of high frequency signals, and the target areas of the semiconductor device to include identified regions of high frequency signals.

6. The system of claim 1, further comprising determining a varying isolation mold depth based on RF frequency signal regions of the semiconductor device.

7. A method for fabricating a device that enhances radio frequency (RF) signal integrity, the method comprising:
   determining one or more high frequency components from a plurality of components for a device;
   identifying one or more target areas that include the one or more high frequency components;
   removing one or more coupling regions of the device within the one or more target areas; and
   forming one or more isolation molds within the one or more target areas, wherein the isolation molds are formed with a varying isolation mold depth based on circuitry within a selected component of the one or more high frequency components.

8. The method of claim 7, wherein forming the isolation molds includes forming an encapsulation material within the removed one or more coupling regions.

9. The method of claim 7, further comprising identifying one or more leakage paths between the plurality of components and identifying one or more additional target areas of the one or more target areas based on the identified one or more leakage paths.

10. The method of claim 7, further comprising identifying circuitry that generates harmonics from the plurality of components and identifying one or more additional target areas of the one or more target areas based on the identified circuitry.

11. The method of claim 7, further comprising determining an isolation amount for a circuit within the one or more target areas and determining an isolation mold depth for the one or more isolation molds based on the determined isolation amount.

12. The method of claim 7, further comprising forming an additional one or more high frequency components on the one or more isolation molds.

13. The method of claim 7, wherein the one or more high frequency components comprise radio frequency (RF) circuitry.

14. A fabricating system comprising:
a process tool configured to perform fabrication processes on a semiconductor device; and
a control unit configured to control the process tool and to identify target areas of the semiconductor device that convey high frequency signals, remove underlying substrate material of the target areas and form a plurality of isolation molds within the target areas.

15. The system of claim 14, wherein the target areas include one or more of a metal line, a capacitor, a metal capacitor, a transistor, an isolator, a resistor, a terminal, a contact and an inductor.

16. The system of claim 14, wherein the isolation molds include an encapsulation material.

17. The system of claim 14, further comprising determining an isolation mold depth of the plurality of isolation molds based on identified high frequency components.

18. A method for fabricating a device, the method comprising:
providing a semiconductor device having a chip and a plurality of components formed thereon;
identifying one or more RF leakage paths between the plurality of components that handle high frequency signals;
identifying one or more target areas that include the one or more RF leakage paths;
removing one or more coupling regions of the chip within the one or more target areas; and
forming one or more isolation molds within the one or more target areas.

19. The method of claim 18, wherein forming the isolation molds includes forming an encapsulation material within the removed one or more coupling regions.

20. The method of claim 18, wherein forming the one or more isolation molds includes forming an isolation mold within a sidewall of the one or more target areas.

21. The method of claim 18, further comprising determining a radio frequency (RF) isolation amount for a circuit within the one or more target areas and determining an RF isolation mold depth for the one or more isolation molds based on the determined RF isolation amount.

22. The method of claim 18, further comprising one or more high frequency components and determining a varying isolation mold depth based on the one or more high frequency components.

* * * * *